US012040335B2

(12) United States Patent
Roy (10) Patent No.: US 12,040,335 B2
(45) Date of Patent: Jul. 16, 2024

(54) IMAGE AND DEPTH PIXEL

(71) Applicant: STMicroelectronics (Crolles 2) SAS, Crolles (FR)

(72) Inventor: Francois Roy, Seyssins (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 90 days.

(21) Appl. No.: 17/944,529

(22) Filed: Sep. 14, 2022

(65) Prior Publication Data

US 2023/0090264 A1   Mar. 23, 2023

(30) Foreign Application Priority Data

Sep. 17, 2021 (FR) ...................... 2109786

(51) Int. Cl.
| | | |
|---|---|---|
| *H01L 27/146* | (2006.01) | |
| *H04N 25/53* | (2023.01) | |
| *H04N 25/621* | (2023.01) | |
| *H04N 25/705* | (2023.01) | |
| *H04N 25/75* | (2023.01) | |
| *H04N 25/77* | (2023.01) | |

(52) U.S. Cl.
CPC .... *H01L 27/14603* (2013.01); *H01L 27/1463* (2013.01); *H04N 25/53* (2023.01); *H04N 25/621* (2023.01); *H04N 25/705* (2023.01); *H04N 25/75* (2023.01); *H04N 25/77* (2023.01)

(58) Field of Classification Search
CPC ........... H01L 27/14603; H01L 27/1463; H01L 27/1464; H01L 27/14645; H01L 27/14614; H04N 25/53; H04N 25/621; H04N 25/705; H04N 25/75; H04N 25/77; H04N 25/771
See application file for complete search history.

(56) References Cited

U.S. PATENT DOCUMENTS

2006/0289911 A1* 12/2006 Lee ...................... H01L 27/1463
257/292
2009/0284731 A1* 11/2009 Jin ......................... G01B 11/22
356/4.01

(Continued)

FOREIGN PATENT DOCUMENTS

| CN | 111599828 A | 8/2020 |
|---|---|---|
| WO | 2017174456 A1 | 10/2017 |

OTHER PUBLICATIONS

INPI Search Report and Written Opinion for priority application, FR 2109786, report dated May 18, 2022, 8 pgs.

*Primary Examiner* — Abdelaaziz Tissire
(74) *Attorney, Agent, or Firm* — Crowe & Dunlevy LLC (57) ABSTRACT

A sensor includes pixels supported by a substrate doped with a first conductivity type. Each pixel includes a portion of the substrate delimited by a vertical insulation structure with an image sensing assembly and a depth sensing assembly. The image sensing assembly includes a first region of the substrate more heavily doped with the first conductivity type and a first vertical transfer gate completely laterally surrounding the first region. Each of the depth sensing assemblies includes a second region of the substrate more heavily doped with the first conductivity type a second vertical transfer gate opposite a corresponding portion of the first vertical transfer gate. The second region is arranged between the second vertical transfer gate and the corresponding portion of the first vertical transfer gate.

19 Claims, 4 Drawing Sheets

(56) References Cited

U.S. PATENT DOCUMENTS

| | | | |
|---|---|---|---|
| 2010/0141821 A1* | 6/2010 | Fossum | H01L 27/14641 |
| | | | 257/E31.097 |
| 2011/0089311 A1* | 4/2011 | Venezia | H01L 27/14689 |
| | | | 257/E31.073 |
| 2013/0113969 A1* | 5/2013 | Manabe | H01L 27/14612 |
| | | | 348/308 |
| 2014/0183685 A1 | 7/2014 | Roy et al. | |
| 2018/0294304 A1* | 10/2018 | Janssens | H01L 27/1463 |
| 2019/0280024 A1* | 9/2019 | Roy | H01L 27/14689 |
| 2019/0378864 A1* | 12/2019 | Innocent | H04N 25/75 |
| 2021/0020675 A1* | 1/2021 | Roy | H01L 27/14638 |

\* cited by examiner

Fig. 9

IMAGE AND DEPTH PIXEL

PRIORITY CLAIM

This application claims the priority benefit of French Application for Patent No. 2109786, filed on Sep. 17, 2021, the content of which is hereby incorporated by reference in its entirety to the maximum extent allowable by law.

TECHNICAL FIELD

The present disclosure generally concerns pixels and, in particular, pixels of an image sensor and pixels of a depth map sensor.

BACKGROUND

An image sensor enables to acquire images, for example, color or black-and-white, of a scene, these images generally being in two dimensions.

A depth map sensor enables to acquire a mapping of the depths between the objects of the scene or, in other words, a mapping of the distances between the sensor and the objects of the scene.

There exist sensors enabling to acquire images of a scene and depth maps of this scene. Such sensors are called image and depth sensors. Such sensors comprise pixels specifically configured to enable to acquire an image, called image pixels, and pixels configured to enable to acquire a depth map, called depth pixels, the image pixels being structurally different from the depth pixels.

However, the joint integration of image pixels with depth pixels causes various problems, for example, when the photoconversion areas of these pixels are all implemented in a same semiconductor substrate.

There is a need to solve at least some disadvantages of known image and depth sensors.

For example, it would be desirable to have an image and depth sensor where all pixels are identical.

For example, it would be desirable to have an image and depth sensor where all pixels are identical and enable to acquire, according to the way in which they are controlled, either a color or black-and-white image of a scene, or a depth map of the scene.

SUMMARY

An embodiment overcomes all or part of the disadvantages of known image and depth sensors.

An embodiment provides a sensor comprising a pixel array and a doped semiconductor substrate of a first conductivity type, each pixel comprising: a portion of the substrate laterally delimited by a vertical insulation structure; a first region of the first conductivity type more heavily doped than the substrate; a first vertical transfer gate surrounding the first region; and at least two assemblies. Each assembly comprises: a second region of the first conductivity type more heavily doped than the substrate, and a second vertical transfer gate arranged opposite a corresponding portion of the first transfer gate, said second region being arranged between said second transfer gate and said corresponding portion of the first transfer gate.

According to an embodiment, in each pixel: the vertical insulation structure penetrates into the substrate from a first surface of the substrate, preferably across the entire thickness of the substrate; the first region and each second region are arranged in the substrate on the side of said first surface; and the first transfer gate and each second transfer gate penetrate into the substrate from said first surface.

According to an embodiment, in each pixel, each second transfer gate penetrates into the substrate deeper than the first transfer gate.

According to an embodiment, neighboring pixels at least partly share their vertical insulation structures.

According to an embodiment, in each pixel, each second transfer gate forms a portion of the vertical insulation structure of said pixel.

According to an embodiment, in each pixel, each second transfer gate is shared with a pixel neighboring said pixel.

According to an embodiment, in each pixel, each second transfer gate is arranged between said corresponding portion of the first transfer gate of said pixel and a portion of the vertical insulation structure.

According to an embodiment, in each assembly of a second transfer gate and of a second region, the second region is in contact with said second transfer gate.

According to an embodiment, each pixel comprises a first readout circuit coupled to the first region and, for each second region, a second readout circuit coupled to said second region.

According to an embodiment, the sensor further comprises a control circuit configured to control the first and second transfer gates of the pixels.

According to an embodiment, the control circuit is also configured to control the first and second readout circuits.

According to an embodiment, during an acquisition of an image by the pixels, the control circuit is configured, in each pixel, to maintain the first transfer gate and each second transfer gate of said pixel in the off-state during a phase of integration by said pixel, and to switch the first transfer gate to the on-state during a phase of reading out from said pixel. Furthermore, during an acquisition of a depth map by the pixels, the control circuit is configured, in each pixel, to successively switch, several times, each of the second transfer gates to the on-state during a phase of integration by said pixel, preferably while controlling the first gate to implement an anti-blooming device, and to maintain each of the second transfer gates in the off-state during a phase of reading out from said pixel, preferably while maintaining the first transfer gate of said pixel in the on-state.

According to an embodiment, during the acquisition of an image by the pixels, the control circuit is configured so that the sensor operates in a rolling shutter mode and, during the acquisition of a depth map by the pixels, the control circuit is configured so that the sensor operates in a global shutter mode.

According to an embodiment, for each second region of each pixel, a capacitive element, for example, of metal-insulator-metal type, is connected to said second region.

An embodiment provides an electronic device, for example, a smartphone, comprising a sensor such as described hereabove.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the pixel control and readout circuits described hereafter have not been detailed, the implementation of these circuits being within the abilities of those skilled in the art and the pixels of the described embodiments being compatible with usual image pixel readout circuits and with usual depth pixel readout circuits.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

The present description provides an image and depth sensor having an array of identical pixels, each enabling to selectively acquire image data during the acquisition of a color or black-and-white image by the sensor, or depth data during the acquisition of a depth map by the sensor.

Figure 1:
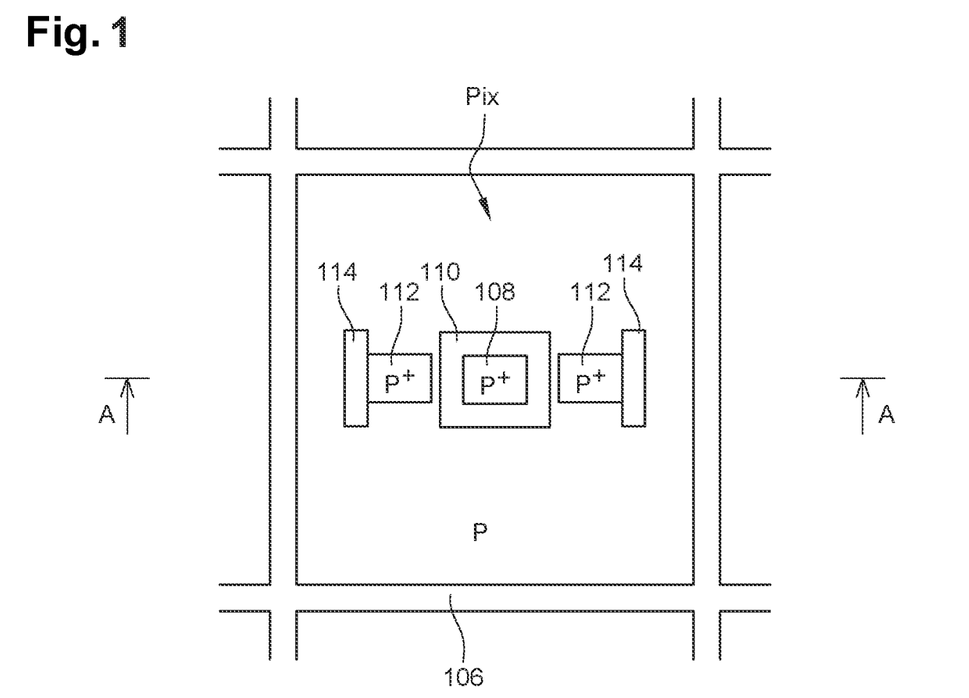
FIG. 1 shows, in a simplified top view, a portion of a pixel array of an image and depth sensor according to an embodiment.
Figure 2:
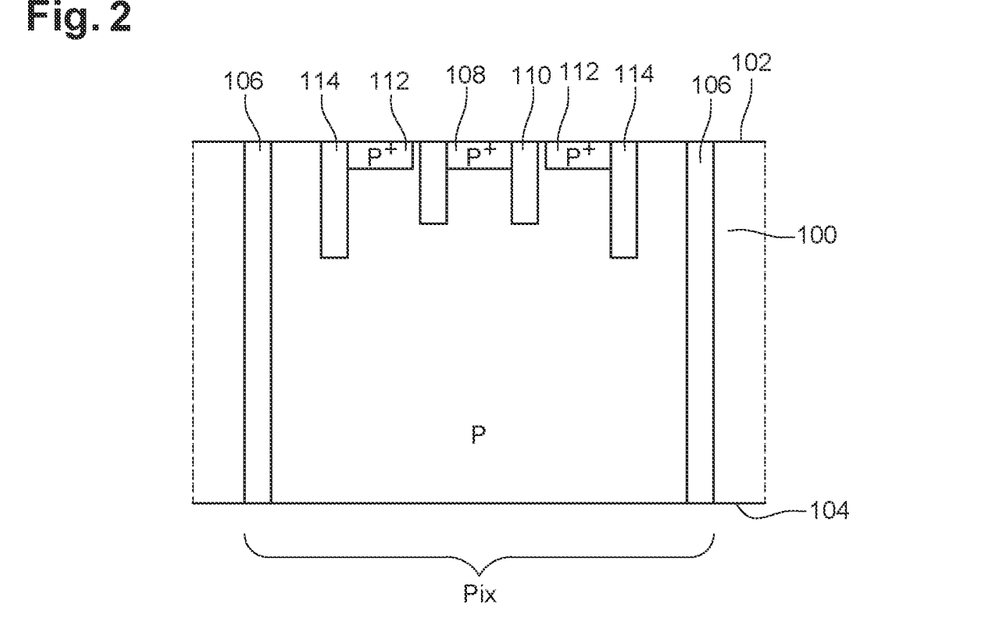
FIG. 2 corresponds to a simplified cross-section view of the sensor of FIG. 1, taken along a cross-section plane AA of FIG. 1.

FIG. 1 shows, in a simplified top view, a portion of a pixel array Pix of an image and depth sensor according to an embodiment. FIG. 2 corresponds to a simplified cross-section view of the sensor of FIG. 1, taken along a cross-section plane AA of FIG. 1. More particularly, FIGS. 1 and 2 illustrate an embodiment of the sensor pixels Pix. In FIGS. 1 and 2, a single pixel Pix is fully shown, the other pixels of the array being identical to this pixel Pix.

The sensor comprises a semiconductor substrate 100 (FIG. 2), for example, made of silicon. The substrate 100 is doped with a first conductivity type. Preferably, there is a doping gradient in the substrate 100 where the doping level of substrate 100, for the first conductivity type, increases as the distance to a surface 102 of substrate 100 (the upper surface in FIG. 2) decreases. This doping gradient favors the displacement of the photogenerated useful charges towards this surface 102. However, in an alternative embodiment, the substrate 100 may instead be uniformly doped.

As an example, the substrate is here P-type doped. In the case of a P-type substrate, the photogenerated useful charges are holes. The useful charges are photogenerated in substrate 100 when a light radiation reaches this substrate 100, for example from a surface 104 (lower surface in FIG. 2) opposite to surface 102, and the light radiation results in the photogeneration of electron-hole pairs in substrate 100.

Pixel Pix comprises a portion of substrate 100, for example a portion extending vertically from surface 102 to surface 104 of substrate 100. This portion of substrate 100 is laterally delimited by a vertical insulation structure 106.

As an example, the vertical insulation structure penetrates vertically into substrate 100 from its surface 102. Preferably, structure 106 extends vertically across the entire thickness of substrate 100, from surface 102 to surface 104.

As an example, structure 106 is a capacitive deep trench isolation (CDTI), that is, as well known by those skilled in the art, a trench having its walls coated with an insulating layer and being filled with a conductor. As an example, when the substrate is of type P and the photogenerated useful charges are holes, in operation, the conductor of structure 106 is biased to a high potential, for example, the power supply potential Vdd of the sensor, to form an electron layer along structure 106. As an example, the electron layer thus formed is biased to a potential lower than power supply potential Vdd, for example, slightly lower than potential Vdd, for example in the order of Vdd—300 mV. As an example, the electron layer is biased via an N-type doped region (not shown) arranged in mechanical/physical contact with structure 106 on the side of surface 102.

According to another example, structure 106 is a deep trench isolation (DTI), that is, a trench filled with an insulator. As an example, when the substrate is of type P and the photogenerated useful charges are holes, a heavily-doped N-type layer may be formed along structure 106. As an example, this N-type doped layer is biased to a high potential, for example, power supply voltage Vdd. As an example, the electron layer is biased via an N-type doped region (not shown) arranged in contact with structure 106 on the side of surface 102.

As an example, as shown in FIGS. 1 and 2, pixel Pix shares portions of its insulation structure 106 with the pixels which surround it, that is, its neighboring pixels. In other words, neighboring pixels at least partly share their insulation structures 106. Still in other words, when a portion of the insulation structure 106 of a pixel of the sensor separates this pixel from a neighboring pixel, then this portion of the insulation structure is shared by these two pixels.

To allow the acquisition of a color or black-and-white image by the sensor, pixel Pix formed in the portion of the substrate 100 laterally delimited by the insulation structure 106 comprises a region 108 and a vertical transfer gate 110.

Region 108 is of the same doping type as substrate 100, but more heavily doped (P+) than substrate 100. Region 108 is arranged on the side of the surface 102 of substrate 100. For example, region 108 is flush with surface 102 of substrate 100.

Vertical transfer gate 110 surrounds region 108. In other words, gate 110 forms, in top view, a ring around the region, for example, a square-shaped ring. As an example, region 108 is in contact with the surrounding gate 110, for example all along its periphery or, in other words, all along its lateral edges. However, this contact of the periphery of region 108 with gate 110 is not indispensable due to the fact that gate 110 enables a bulk conduction with its associated channel, which forms substantially at the center of the ring formed by gate 110.

As an example, as usual for those skilled in the art, vertical gate 110 is formed in a gate trench extending into the substrate 100 from surface 102 and comprises a gate conductor, for example, made of one or a plurality of conductive materials, for example of doped polysilicon, and a gate insulating layer, for example, a single layer of an insulating material or a stack of layers made of a plurality of insulating materials, separating the gate conductor from substrate 100 and from region 108.

Gate 110 penetrates into substrate 100 from surface 102. Gate 110 penetrates into substrate 100 across a portion only of the thickness of substrate 100. Gate 110 penetrates into substrate 100 deeper than region 108.

When gate 110 is in the on-state, the photogenerated useful charges accumulated in the portion of substrate 100 of pixel Pix are transferred to region 108. As an example, when substrate 100 is P-type doped and the useful charges are holes, gate 110 is made conductive by applying a low potential or level, for example, ground GND, to the conductor of gate 110.

When gate 110 is in the off-state, this prevents the transfer to region 108 of the photogenerated useful charges accumulated in the portion of substrate 100 of pixel Pix. As an example, when substrate 100 is P-type doped and the useful charges are holes, gate 110 is made non-conductive by applying a high potential or level, for example, power supply potential Vdd, to the conductor of gate 110.

Preferably, region 108 and the gate 110 which surrounds it are arranged in a central portion of pixel Pix, that is, in a central portion of pixel Pix in top view.

To allow the acquisition of a depth map by the sensor, pixel Pix formed in the portion of the substrate 100 laterally delimited by the insulation structure 106 further comprises at least two assemblies of a region 112 and of a vertical transfer gate 114. In the example of FIGS. 1 and 2, pixel Pix comprises two assemblies of a region 112 and of a gate 114. In other examples, not illustrated, pixel Pix comprises three or four assemblies of a region 112 and of a gate 114. The assemblies are arranged around the vertical transfer gate 110 which surrounds region 108.

Region 112 is of the same doped type as substrate 100, but more heavily doped (P+) than substrate 100. As an example, each region 112 is doped with a doping level substantially equal, for example, equal, to the doping level of region 108. Each region 112 is arranged on the side of surface 102 of substrate 100. For example, each region 112 is flush with the surface 102 of substrate 100.

Each vertical transfer gate 114 is arranged opposite a corresponding portion of transfer gate 110. For example, in FIG. 1, transfer gate 110 has, in top view, the shape of a substantially square ring, and a first gate 114 is arranged opposite a portion of the gate 110 corresponding to a first side of this square, a second gate 114 being arranged opposite a portion of gate 110 corresponding to a second side of this square, for example, opposite to the first side of the square. However, gate 110 may have, in top view, other shapes such as for example a substantially circular shape.

Preferably, in top view, each transfer gate 114 extends substantially parallel to the portion of gate 110 facing it.

Although FIG. 1 shows an example where each gate 114 has a length substantially equal to that of the portion of gate 110 facing it, each gate may be shorter or longer than the portion of gate 110 facing it.

In each assembly of a gate 114 and of a region 112, region 112 extends, or is arranged, between gate 114 and the corresponding portion of gate 110 facing gate 114. Preferably, in each assembly of a gate 114 and of a region 112, region 112 is in contact with gate 114. Indeed, gate 114 controls the forming of a conduction channel along gate 114, and this contact between gate 114 and region 112 allows a better charge transfer to region 112. However, in each assembly of a gate 114 and of a region 112, it is possible for region 112 not to be in contact with gate 114. Further, preferably, each region 112 is not in contact with gate 110, to avoid for gate 110 to disturb this region 110, although this is not indispensable and each region 112 may be in contact with gate 110.

As an example, as usual for those skilled in the art, each vertical gate 114 is formed in a gate trench extending into the substrate 100 from surface 102 and comprises a gate conductor, for example, made of one or a plurality of conductive materials, for example, made of doped polysilicon, and a gate insulator layer, for example, a single layer of an insulating material or a stack of layers made of a plurality of insulating materials, separating gate conductor 114 from substrate 100 and from the corresponding region 112.

Each gate 114 penetrates into substrate 110 from surface 102. Each gate 114 penetrates into substrate 100 across a portion only of the thickness of substrate 100. Each gate 114 penetrates into substrate 100 deeper than regions 112.

When a gate 114 is in the on-state, preferably while gate 110 and the other gate 114 are in the off-state, the useful charges photogenerated and accumulated in the portion of substrate 100 of pixel Pix are transferred to the region 112 associated with this gate 114. As an example, when substrate 100 is P-type doped and the useful charges are holes, one or the other of gates 114 is made conductive by the application of a low potential or level, for example, the ground, to the conductor of this gate 114.

When gates 114 are in the off state, this prevents the transfer, to regions 114, of the useful charges photogenerated and accumulated in the portion of the substrate 100 of pixel Pix. As an example, when substrate 100 is P-type doped and the useful charges are holes, each gate 114 is made non-conductive by the application of a high potential or level, for example, power supply potential Vdd, to the conductor of gate 114. As an example, during the acquisition of a depth map, the gates 114 of pixel Pix are sequentially switched to the on state one after the other, preferably for an identical time period for each gate 114, with or without an overlapping of their on-states, so that the photogenerated useful charges are alternately transferred to each of regions 112. A sequence corresponding to the successive switching of each of the gates 114 of pixel Pix is, preferably, repeated a large number of times during an integration period corresponding to the acquisition of a depth map by the sensor.

As an example, when the sensor acquires a color or black-and-white image, gates 114 are maintained non-conductive during the integration period corresponding to this acquisition, gate 110 being also maintained non-conductive, and during the period of reading out from pixel Pix corresponding to this acquisition, gate 110 then being switched to the on-state to transfer useful charges from substrate 100 to region 108.

Although this is not shown in FIGS. 1 and 2, the sensor comprises a control circuit configured to control gates 110 and 114 as described hereabove.

According to an embodiment, the gate trench for each gate 114 penetrates into substrate 100 deeper than the gate trench for gate 110. This enables to favor, when a gate 114 is set to the on-state and gate 110 is in the off-state, the transfer of the photogenerated useful charges which are located under the assembly of gate 110 and of region 108, to the region 112 associated with this gate 114.

According to an embodiment, although this is not illustrated in FIGS. 1 and 2, each region 112 is coupled, for example connected, to an electrode of a corresponding capacitive element forming, for example, a memory cell. In such an embodiment, during the acquisition of a depth map, the sensor can operate in a global shutter mode, each pixel then operating in the voltage domain. In this example where the photogenerated useful charges are holes, the other electrode of the capacitive element is coupled, for example, connected, to a high potential or level, for example, potential Vdd. In another example, not illustrated, where the photogenerated useful charges are electrons (N-type doped substrate 100), the other electrode of the capacitive element is coupled, for example, connected, to a low potential or level, for example, ground potential GND.

According to an embodiment, for each region 114, the capacitive element which is associated therewith is of metal-insulator-metal (MIM) type. As an example, for each region 114, the capacitive element which is associated therewith is implemented in an interconnection structure resting on surface 102 of substrate 100. This interconnection structure is, for example, that provided for substrate 100 and is configured to connect together and to the outside elements formed from substrate 100. In the case where substrate 100 is assembled with another semiconductor substrate, for example, by molecular bonding of the interconnection structure of substrate 100 to the interconnection structure of this other substrate, the capacitive element may be implemented in one or the other of these interconnection structures.

According to an embodiment, in each pixel Pix, the portion of substrate 100 where charges are photogenerated when the sensor receives light and the vertical insulation structures 106 which surround this portion of substrate 100 are configured so that this portion of substrate 100 corresponds to or implements a pinned photodiode. According to an embodiment, during the acquisition of a color or black-and-white image, the sensor may operate in rolling shutter mode, each pixel then operating, for example, in the charge domain.

In an alternative embodiment, region 108 is coupled, for example, connected, to an electrode of a capacitive element, for example, of MIM type, similarly to what has been previously described for each of regions 112, so that, during the acquisition of a color or black-and-white image, the sensor can operate in global shutter mode, each pixel Pix then operating, for example, in the voltage domain.

Preferably, the sensor of FIGS. 1 and 2 is configured to receive light, for example visible light and/or infrared light, on the side of its surface 104. The sensor is thus of the type commonly referred to in the art as being back side illuminated.

Although this is not shown in FIGS. 1 and 2, as an example, each pixel comprises a doped well of the second conductivity type, for example, type N, arranged on the side of surface 102 of the substrate. As an example, one or a plurality of transistors of the pixel are arranged inside and on top of this well of the pixel, for example, transistors of circuits for reading out from the pixel. As an example, in the case where substrate 100 is assembled to another semiconductor substrate (three-dimensional integration), transistors of the readout circuits and/or of the control circuit and/or of a circuit for processing the data read from the pixels may be formed from this other substrate, that is, be arranged inside and on top of this other substrate. According to another example, when substrate 100 is not assembled to another semiconductor substrate (monolithic integration), all the transistors of the sensor circuits, for example, of pixel readout circuits and/or of the pixel control circuit and/or of the circuit for processing the read data, are implemented from substrate 100.

Preferably, in each pixel Pix, a heavily-doped layer of the second conductivity type, for example, of type N in this example where the photogenerated useful charges are holes, is formed at the surface 102 of substrate 100, this layer being for example only interrupted by structure 106, gates 110 and 144, and regions 108 and 112.

In the embodiment of FIGS. 1 and 2, each gate 114 is arranged between gate 110 and insulation structure 106. In other words, each gate 114 is separated from structure 106 by a portion of substrate 100. Thus, each pixel Pix of the pixel array of the sensor has its own transfer gates 114 that it does not share with its neighboring pixels.

Figure 3:
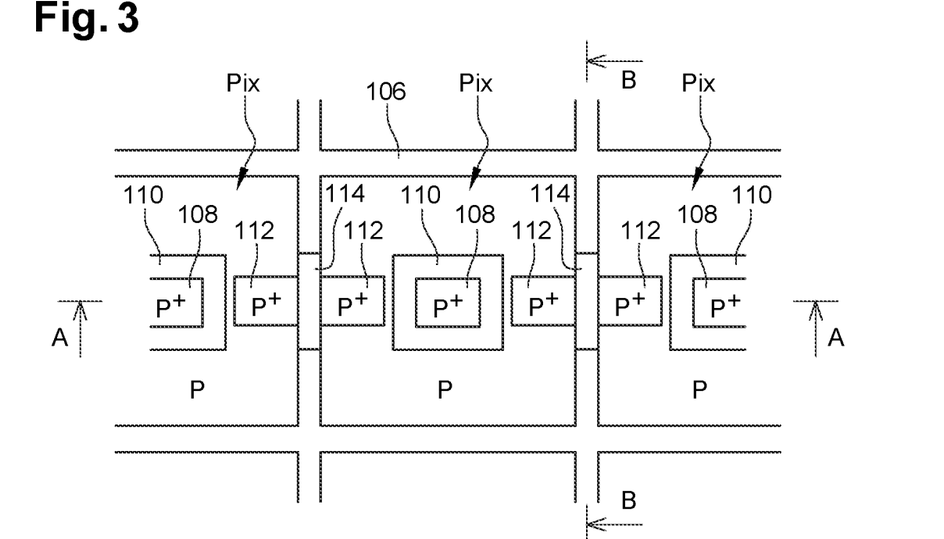
FIG. 3 shows, in a simplified top view, an alternative embodiment of the sensor of FIGS. 1 and 2.
Figure 4:
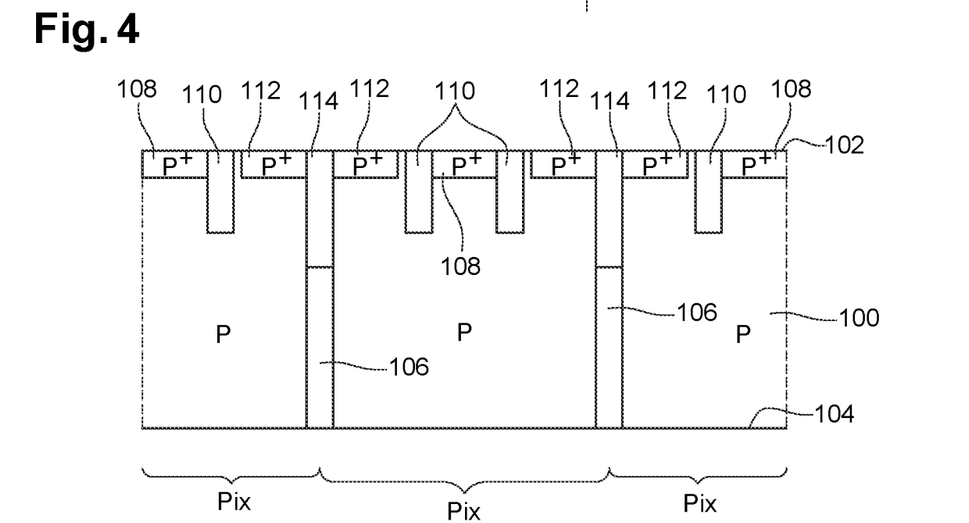
FIG. 4 corresponds to a simplified cross-section view of the sensor of FIG. 3, taken along a cross-section plane AA of FIG. 3.
Figure 5:
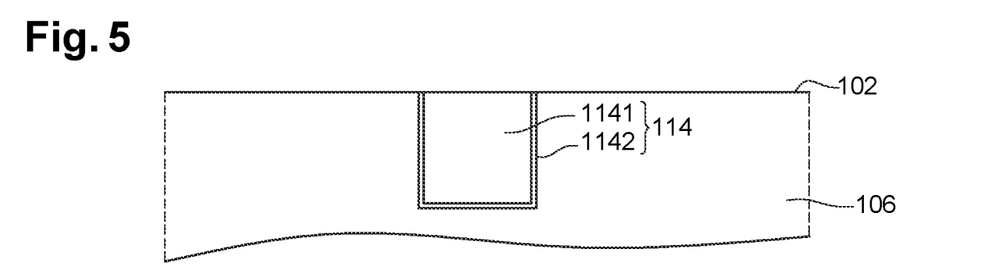
FIG. 5 corresponds to a simplified cross-section view of the sensor of FIG. 3, taken along a cross-section plane BB of FIG. 3.

FIGS. 3, 4, and 5 illustrate an alternative embodiment of the sensor of FIGS. 1 and 2, wherein each pixel Pix of the array shares its gates 114 with its neighboring pixels, for example, by sharing each of its gates with a different neighboring pixel so that each gate 114 is shared by two neighboring pixels Pix only.

FIG. 3 is a simplified top view of the sensor according to this alternative embodiment, FIG. 4 corresponding to a simplified cross-section view of the sensor of FIG. 3, taken along a cross-section plane AA of FIG. 3, and FIG. 5 corresponding to a simplified cross-section view of the sensor of FIG. 3, taken along a cross-section plane BB of FIG. 3.

Only the differences between the sensor of FIGS. 1 and 2 and that of FIGS. 3 to 5 are here highlighted, and, unless otherwise indicated, all that has been described in relation with FIGS. 1 and 2 applies to the sensor of FIGS. 3 to 5.

In the alternative embodiment of FIGS. 3 to 5, similarly to what has been described as an example in relation with FIGS. 1 and 2, each pixel Pix shares portions of its insulation structure 106 with the pixels Pix surrounding it. Further, in this variant, each gate 114 of each pixel Pix is aligned with, and insulated from, vertical insulation structure 106, and thus can be seen to form a portion of vertical insulation structure 106. In other words, each gate 114 replaces a portion of structure 106. Still in other words, each gate 114 penetrates, from the surface 102 of substrate 100, into structure 106. Preferably, as can be seen in FIG. 3, for each gate 114, the vertical walls of gate 114 which are in respective contact with two neighboring pixels Pix sharing this gate 114, are aligned with the vertical walls of structure 106 which are in respective contact with these two neighboring pixels Pix.

As an example, each gate 114 shared by two neighboring pixels Pix forms a portion of the portion of insulation structure 106 which is shared by these two neighboring pixels.

As an example, FIG. 5 illustrates in further detail a gate 114. Gate 114 comprises a gate conductor 1141 insulated from structure 106 and from substrate 100 by a gate insulator layer 1142.

The provision of a vertical gate 114 forming part of vertical insulation structure 106 between two neighboring pixels, so that this gate 114 is shared between these two neighboring pixels, is for example described in further detail in United States Patent Application Publication No. 2021/0020675 (corresponding to French Patent 3098988), incorporated herein by reference. See, for example, FIGS. 6 to 13. In particular, FIGS. 8 to 13 describe examples of methods of manufacturing such a transfer gate.

The provision of gates 114 as being incorporated in insulation structure 106 enables to avoid the presence of a portion of substrate 100 located between each gate 114 and insulation structure 106, which enables to decrease the dimensions of each pixel Pix with respect to the case of FIGS. 1 and 2.

As an example of dimensions, in the sensor described in relation with FIGS. 1 to 5: the thickness of substrate 100, taken between surfaces 102 and 104, is in the range from 8 to 4 µm, for example substantially equal to 6 µm, for example equal to 6 µm; for each gate 110, the distance between two opposite portions of gate 110, for example, between two parallel sides of gate 110 of square ring shape in top view, is in the range from 200 nm to 400 nm, for example, substantially equal to 300 nm, for example equal to 300 nm; each gate 114 is arranged at a distance from the corresponding portion of gate 110 which is in the range from 300 to 500 nm, for example, substantially equal to 400 nm, for example, equal to 400 nm; each gate 110 penetrates into substrate 100 down to a depth in the range from 0.6 µm to 1 µm, for example substantially equal to 0.8 µm, for example equal to 0.8 µm; and each gate 114 penetrates into substrate 100 down to a depth in the range from 1 µm to 1.5 µm, for example, substantially equal to 1.2 µm, for example, equal to 1.2 µm.

Figure 6:
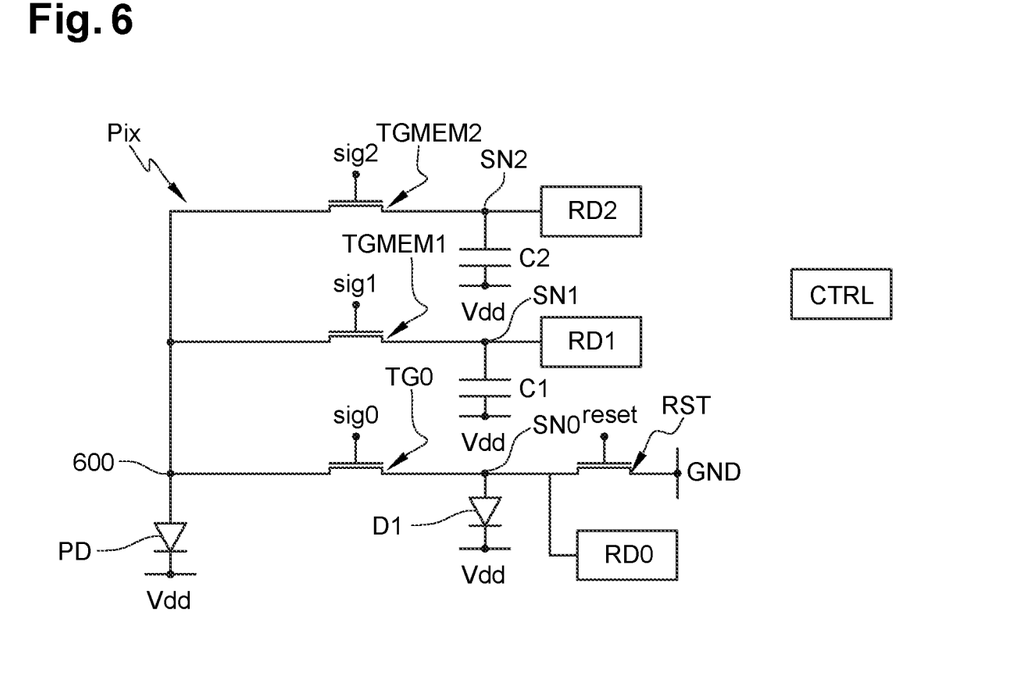
FIG. 6 partially shows a circuit of a pixel of the sensor of FIGS. 1 to 5 according to an embodiment.

FIG. 6 partially shows a circuit of a pixel Pix of the sensor of FIGS. 1 to 5 according to an embodiment.

In particular, in this embodiment, pixel Pix comprises two assemblies of a gate 114 and of a region 112, the gate 114 and the region 112 of a first one of the two assemblies bearing respective references TGMEM1 and SN1 in FIG. 6, and the gate 114 and the region 112 of the second one of the assemblies bearing respective references TGMEM2 and SN2 in FIG. 6. It will be within the abilities of those skilled in the art to adapt the description made hereafter in relation with FIG. 6 to the case of a pixel Pix comprising more than two assemblies of a gate 114 and of a region 112.

In this embodiment, during the acquisition of a depth map, the sensor is configured to operate in global shutter mode. As an example, pixel Pix then comprises a capacitive element C1 connected between node SN1 and a node of application of a high potential or level, for example, potential Vdd, in this example where the useful charges are holes, and a capacitor C2 connected between node SN2 and a node of application of the same high potential or level Vdd.

In FIG. 6, region 108 and gate 110 are respectively designated with references SN0 and TG0. Further, in this embodiment, the sensor is configured to operate in rolling shutter mode on acquisition of a color or black-and-white image. More particularly, in the example of FIG. 6, node SN0 is shown as the electrode of a diode D1. In this example where the useful charges are holes, node SN0 corresponds to the anode of diode D1 and the cathode of diode D1 is connected to a node of application of a high potential or level, for example, potential Vdd. It will be within the abilities of those skilled in the art to adapt the above description to the case where the sensor is configured to operate in global shutter mode during the acquisition of a color or black-and-white image, for example, by connecting a memory cell, for example, in the form of a capacitive element, to node SN0.

In FIG. 6, the portion of the substrate 100 of pixel Pix where charges are photogenerated, that is, for example, a pinned photodiode, is represented by a photodiode PD. In this example, where the photogenerated useful charges are holes, the cathode of photodiode PD is connected to a node of application of a high potential, for example, power supply potential Vdd, and the anode 600 of photodiode PD is coupled to each of nodes SN0, SN1, and SN2 by respective gates TG0, TGMEM1, and TGMEM2.

In FIG. 6, transfer gates TG0, TGMEM1, and TGMEM2 are each shown in the form of a MOS transistor. In this example where the photogenerated useful charges are holes, transistors TG0, TGMEM1, and TGMEM2 have a P channel. As an example, transistor TG0 has a conduction terminal connected to photodiode PD, for example, to the anode 600 of photodiode PD, and another conduction terminal connected to node SN0. As an example, transistor TGMEM1 has a conduction terminal connected to photodiode PD, for example, the anode 600 of photodiode PD, and another conduction terminal connected to node SN1. As an example, transistor TGMEM2 has a conduction terminal connected to photodiode PD, for example, the anode 600 of photodiode PD, and another conduction terminal connected to node SN2. Transistors TG0, TGMEM1, and TGMEM2 receive on their control terminals the respective control signals sig0, sig1, and sig2. The conduction terminals of each of transistors TG0, TGMEM1, and TGMEM2 corresponds, in practice, to the gate conductor of each of the transfer gates, respectively TG0, TGMEM1, and TGMEM2.

As an example, the sensor comprises a control circuit CTRL configured to control gates TG0, TGMEM1, and TGMEM2, that is, to deliver signals sig0, sig1, and sig2 to each pixel Pix of the sensor, and, for example, to also deliver other control signals to these pixels Pix. Preferably, circuit CTRL is common to all the pixels Pix of the sensor.

According to an embodiment, each node SN0, SN1, SN2 is associated, for example, coupled or connected, to a corresponding readout circuit shown in FIG. 6 in the form of a block, respectively RD0, RD1, RD2. As an example, although this is not detailed in FIG. 6, each circuit RD0, RD1, and RD2 is implemented from MOS transistors, for example, from at least one MOS transistor assembled as a source follower and from at least one transistor for selecting the pixel Pix. As an example, each circuit RD0, RD1, and RD2 receives control signals (not illustrated) delivered by control circuit CTRL. The implementation of circuits RD0, RD1, and RD2 is within the abilities of those skilled in the art, many pixel readout circuits being described in the literature, these circuits being adapted to reading out from pixels operating in the voltage domain, or to reading out from pixels operating in the charge domain, and to reading out from pixels implementing image (color or black-and-white) or depth map acquisitions in global shutter mode or in rolling shutter mode.

Preferably, according to an embodiment, the sensor pixels Pix, particularly readout circuits RD0, RD1, and RD2 and control circuit CTRL, are configured so that: during the acquisition of an image (color or black-and-white) by the pixels, the sensor operates in rolling shutter mode, and during the acquisition of a depth map by the pixels, the sensor operates in global shutter mode.

Such an embodiment enables to avoid the provision of an intermediate (charge or voltage) memory area coupled to node SN0.

Such an embodiment further enables to implement the acquisition of a depth map by illuminating the scene to be captured only during an integration time period, common or simultaneous for all the sensor pixels. The illumination of a scene to be captured for the acquisition of a depth map generally being implemented by a laser delivering an amplitude-modulated infrared light, this enables to decrease the time of use of the laser, and thus the resulting electric power consumption.

Operations in global shutter mode or in rolling shutter mode are well known by those skilled in the art and will not be detailed herein. Further, it will be within the abilities of those skilled in the art to adapt the sensor to the case where the acquisition of a color of black-and-white image is implemented according to a global shutter mode, for example by providing a (charge or voltage) memory area coupled to node SN0 and/or to the case where the acquisition of a depth map is implemented according to a rolling shutter mode.

According to an embodiment, pixel Pix comprises a transistor RST configured to initialize the potential of node SN0, for example at a low initialization potential or level in the case where the photogenerated useful charges are holes, for example, at ground GND. Transistor RST may form part of readout circuit RD0.

Transistor RST is, for example, a MOS transistor. Transistor RST has a conduction terminal coupled, preferably connected, to node SN0, and another conduction terminal coupled, preferably connected, to a node at the initialization potential, that is, ground GND in this example. The control terminal of transistor RST receives a control signal reset. As an example, signal reset is delivered by circuit CTRL.

Figure 7:
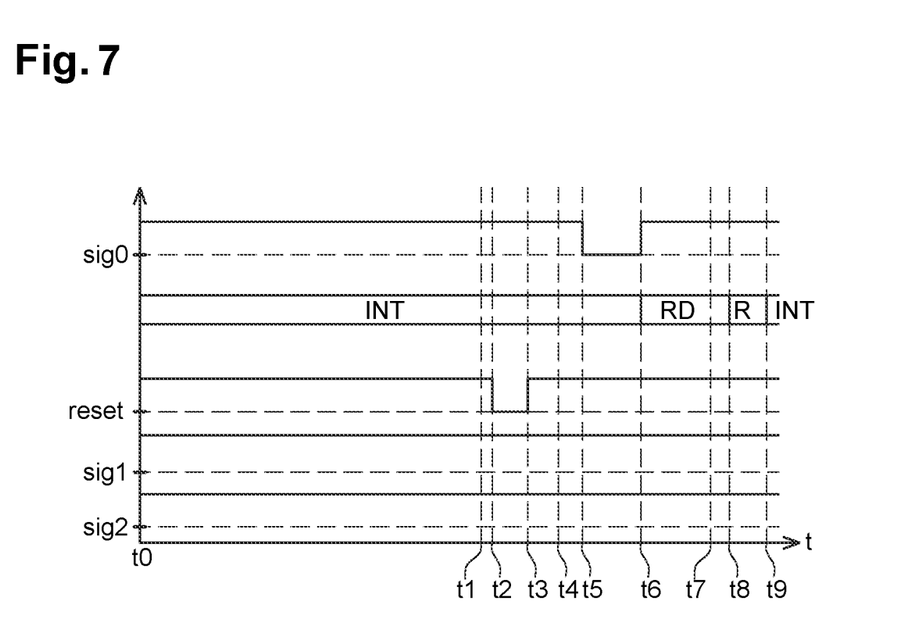
FIG. 7 illustrates, in timing diagrams, an example of an implementation mode of a color or black-and-white image acquisition in the sensor of FIGS. 1 to 5.

FIG. 7 illustrates, in timing diagrams, an example of an implementation mode of a color or black-and-white image acquisition in the sensor of FIGS. 1 to 5.

In this example, each pixel Pix of the sensor is of the type illustrated in relation with FIG. 6, that is, during the acquisition of a color or black-and-white image by the sensor, each pixel Pix operates in the charge domain and the sensor operates in rolling shutter mode. In other words, the operation of the pixel Pix described herein is preferably common and simultaneous in all the pixels Pix of the row to which this pixel belongs.

It will be within the abilities of those skilled in the art to adapt the description made hereafter in relation with FIG. 7 to the case where, during the acquisition of a color or black-and-white image by the sensor, each pixel Pix operates in the voltage domain and/or the sensor operates in global shutter mode.

In this example, the photogenerated useful charges are holes.

At a time t0, pixel Pix is in a light integration phase INT, that is, for example, useful charges are photogenerated by light reaching the pixel, and these useful charges are accumulated in the pixel photodiode PD. For this purpose, gates TG0, TGMEM1, and TGMEM2 are in the off-state and receive, for example, respective signals sig0, sig1, and sig2 in the high state or level.

Although this is not illustrated in FIG. 7, before time t0, integration phase INT starts at the end of a phase R of initialization of photodiode PD during which photodiode PD is emptied of the photogenerated charges that it contains.

At a time t1 subsequent to time t0, pixel Pix is selected. As an example, pixel Pix is selected by switching a selection signal delivered to circuit RD0 by circuit CTRL, for example, to electrically couple a node of circuit RD0 to a pixel readout line, for example, common to all the pixels of a same column. As an example, the node of circuit RD0 is coupled to the readout line by a selection MOS transistor set to the on-state by the switching of the selection signal.

Between times t2 and t3, preferably subsequent to time t1, node SN0 is initialized. For this purpose, transistor RST is switched to the on-state at time t2, and then switched to the off-state at time t3.

At a time t4 subsequent to times t1, t2, and t3, the initialized state of node SN0 may be read by circuit RD0, for example over the readout line to which this circuit RD0 is coupled.

Between a time t5 subsequent to time t4 and a time t6 subsequent to time t5, the useful charges photogenerated and accumulated in photodiode PD since the beginning of phase INT are transferred to node SN0, by the switching of gate TG0 to the on-state at time t5, for example, by the switching of signal sig0 to the low state or level, and then to the off-state at time t6, for example, by the switching of signal sig0 to the high state or level.

Time t6 marks the end of the integration phase INT of pixel Pix and the beginning of a pixel readout phase RD.

At a time t7 subsequent to time t6, the state of node SN0 after the charge transfer is read, for example, circuit RD0, for example, over the readout line to which this circuit RD0 is coupled.

At a time t8, subsequent to time t7, the pixel is deselected, which marks the end of readout phase RD. As an example, pixel Pix is deselected by the switching of the selection signal delivered to circuit RD0 by circuit CTRL, for example, to switch to the off-state the selection transistor of circuit RD0. Preferably, when pixel Pix is deselected, the pixels Pix of a next row of the sensor are selected.

After time t8, for example, immediately after time t8, the pixel photodiode PD is initialized during an initialization phase R. This phase R comprises emptying photodiode PD of all the photogenerated charges that might be present therein. The end of phase R, at a time t9 subsequent to time t8, marks, for example, the beginning of a new phase of integration INT by the pixel.

As an example, phase R is implemented by simultaneously making gate TG0 and transistor RST conductive. According to another example, a MOS transistor for initializing photodiode PD (not illustrated in FIG. 6) is provided in pixel Pix, this transistor being set to the on-state to couple photodiode PD, for example, its anode 600, to the initialization potential of photodiode PD. As an example, this transistor has a conduction terminal coupled to the anode 600 of photodiode 600, a conduction terminal coupled to potential GND, and a control terminal receiving a control signal delivered by circuit CTRL.

The above method is likely to have many variations. For example, the phase of charge transfer between times t4 and t6 may be implemented before the phase of initialization of node SN0 between times t2 and t3. However, whatever the envisaged variations, when a pixel Pix is in an integration phase corresponding to an acquisition of a color or black-and-white image, gates TG0, TGMEM1, and TGMEM2 are maintained non-conductive, and, when pixel Pix is in the readout phase following this integration phase, gate TG0 is switched to the on-state to transfer, to node SN0, the useful charges photogenerated and accumulated in photodiode PD during integration phase INT.

Figure 8:
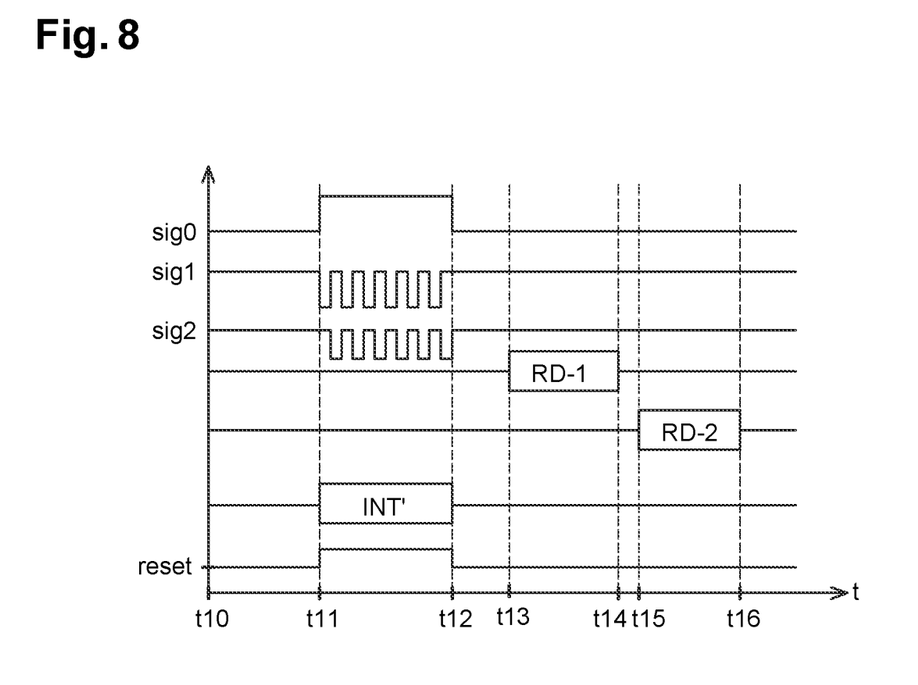
FIG. 8 illustrates, in timing diagrams, an example of an implementation mode of an acquisition of a depth map in the sensor of FIGS. 1 to 3.

FIG. 8 illustrates, in timing diagrams, an example of implementation mode of an acquisition of a depth map in the sensor of FIGS. 1 to 5.

In this example, each pixel Pix of the sensor is of the type illustrated in relation with FIG. 6, that is, during the acquisition of a depth map by the sensor, each pixel Pix operates in the voltage domain and the sensor operates in global shutter mode. Thus, the integration phase Int' of the pixel Pix described herein is common and simultaneous in all the sensor pixels Pix, and the phase of reading out from pixel Pix is implemented simultaneously for all the pixels of a same row, by reading from the sensor rows one after the others.

It will be within the abilities of those skilled in the art to adapt the description made hereafter in relation with FIG. 8 to the case where, during the acquisition of a depth map by the sensor, each pixel Pix operates in the charge domain and/or the sensor operates in rolling shutter mode.

In this example, the photogenerated useful charges are holes.

At a time t10, photodiode PD is in the initialization phase, for example similar to the initialization phase R described in relation with FIG. 7. For example, gate TG0 and transistor RST are in the on-state, for example due to the fact that signals sig0 and reset are in the low state. As a variant, a specific device of initialization of photodiode PD may be provided, similarly to what has been described as an example in relation with FIG. 7.

Preferably, during the phase of initialization of photodiode PD, gates TGMEM1 and TGMEM2 are in the off-state, for example, due to the fact that signals sig1 and sig2 are in the high state.

This initialization phase is implemented simultaneously in all the sensor pixels due to the fact that the latter operates in global shutter mode.

At a time t11 subsequent to time t10, the phase of initialization of photodiode PD ends, for example, by the switching of gate TG0 and, preferably, of transistor RTS, to the off-state, for example, by the switching of signals sig0 and reset to the high state.

Time t11 marks the beginning of an integration phase INT' corresponding to the acquisition of a depth map. Phase INT' ends at a time t12 subsequent to time t11. All along phase INT', gates TGMEM1 and TGMEM2 are successively and alternately switched between their conductive and off-states, for example by the successive and alternate switching of signals sig1 and sig2 between their respective low and high states.

Between times t11 and t12, gate TG0 is maintained in the off-state, for example, due to the fact that signal sig0 is in the high state. This enables to avoid for photogenerated useful charges to be transferred to region SN0 rather than to one or the other of regions SN1 and SN2.

As a variant, between times t11 and t12, gate TG0 is maintained in an intermediate state between its on-state and its off-state, for example, by the application thereto of a signal sig0 at an intermediate potential between the potential corresponding to the low state of signal sig0 and the potential corresponding to the high state of signal sig0. In this case, gate TG0 corresponds to or implements an anti-blooming device.

In the case where gate TG0 is not used as an anti-blooming device, a specific anti-blooming device distinct from gate TG0 may be provided in each pixel Pix. This device is, for example, a transistor connected between photodiode PD and a potential enabling to discharge the photogenerated useful charges, for example, a transistor connected between the anode 600 of the photodiode and a low potential such as the ground when these useful charges are holes. As an example, this transistor implements the anti-blooming function during phase INT' and the function of initialization of photodiode PD between two successive phases INT', by modifying the potential applied to the gate of this transistor between its operation for the initialization and its anti-blooming operation.

Phase INT' is here implemented simultaneously in all the pixels of the sensor due to the fact that the latter operates in global shutter mode.

At time t12, preferably, gate TG0 is switched to its on-state, transistor RST being, for example, also switched to the on-state. Thereby, gate TG0 is used as a device for ending the integration period, the end of the integration period then corresponding, for example, to the beginning of a phase of initialization, by gate TG0, of photodiode PD.

As a variant, as previously mentioned, a specific device of initialization of the photodiode also used as a device for ending the integration period may be provided, and gate TG0 is then, for example, left in the off-state.

From a time t13 subsequent to time t12, the pixel is read from, all the pixels in the row to which this pixel belongs being preferably simultaneously read from.

In the example of FIG. 8, the reading out from the pixel comprises the reading from node SN1 (phase RD-1) and then the reading from node SN2 (phase RD-2), although the inverse is also possible.

The phase RD-1 of reading from node SN1 is implemented by circuit RD1, between time t13 and a time t14 subsequent to time t13. Then, phase RD-2 of reading from node SN2 is implemented between a time t15 subsequent to time t14 and a time t16 subsequent to time t15. Time t16 marks the end of the pixel readout phase.

The implementation of phases RD-1 and RD-2 and of the corresponding circuits RD1 and RD2, where these circuits may share elements in common, is within the abilities of those skilled in the art.

After time t16, once pixel Pix, and all the other pixels of its row have been read from, the pixels of a next row are read from in turn.

Once all the sensor pixels have been read from, a new phase INT' may be implemented.

Preferably, during the acquisition of a depth map, gate TG0 is advantageously used as a system for initializing photodiode PD and as an anti-blooming system, for example, by maintaining gate TG0 in the on-state during the phase of initialization of photodiode PD and between each integration phase INT' and by maintaining gate TG0 in an intermediate state between its on-state and its off-state during each integration phase INT'.

Figure 9:
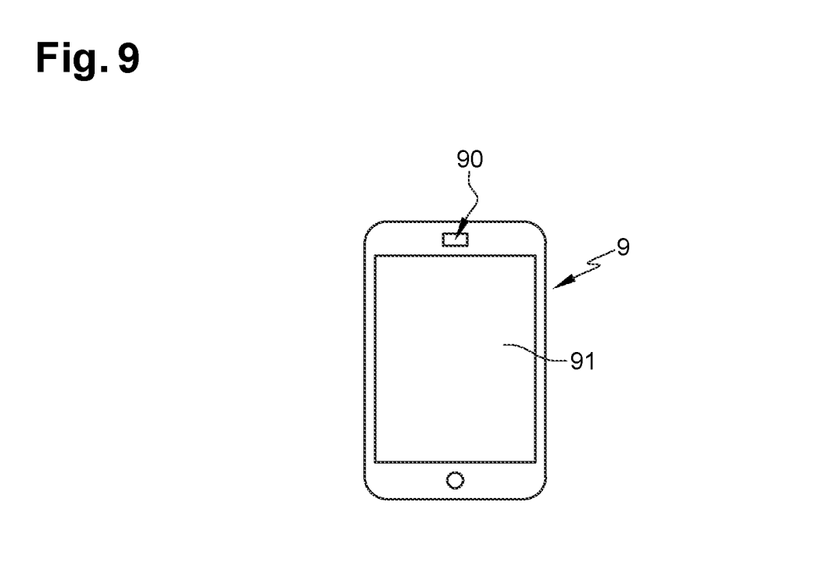
FIG. 9 schematically illustrates an example of an electronic device comprising a sensor of the type described in relation with FIGS. 1 to 8.

FIG. 9 schematically illustrates an example of an electronic device 9 comprising a sensor of the type described in relation with FIGS. 1 to 8.

Device 9 is, in the example of FIG. 9, a smartphone. However, the previously-described sensor may be provided in other electronic devices such as laptop computers, automobile backup cameras, etc.

In the example of FIG. 9, the sensor, designated with reference 90 in FIG. 9, is arranged in a notch formed in the package of device 9. Preferably, this notch is arranged on the surface of device 9 which comprises a display 91. In other examples, sensor 90 is arranged under display 91.

As an example, sensor 90 may be used to take a color or black-and-white picture of the user of device 9, such a picture being currently called "selfie". Sensor 90 may also be used to obtain a depth map, for example, a depth map of the user's face, for example, for user identification purposes. When a color or black-and-white image and a depth map of a same scene are acquired by sensor 90, this may enable, for example, due to processing circuits (not illustrated) of sensor 90, to obtain a color or black-and-white image and in three-dimensions of the scene thus captured.

Various embodiments and variants have been described. Those skilled in the art will understand that certain features of these various embodiments and variants may be combined, and other variants will occur to those skilled in the art.

In particular, all along the description made hereabove in relation with FIGS. 1 to 9, it has been considered as an example that the photogenerated useful charges were holes. It will be within the abilities of those skilled in the art to adapt this description to the case where the photogenerated charges are electrons, for example, by inverting all the P and N conductivity types, by replacing all the P-channel transistors with N-channel transistors, by inverting the high and low potentials (and thus the high and low levels of the described signals) and by inverting the cathodes and the anodes of the described diodes and photodiodes.

Further, it will be within the abilities of those skilled in the art to adapt the description made hereabove for cases where each pixel comprises two assemblies of a gate 114 and of a region 112 to the case where each pixel comprises three or four of these assemblies, for example, by providing additional readout circuits of the type of readout circuits RD1 and RD2.

Further, although this has not been previously indicated, in a sensor comprising a plurality of pixels Pix such as described, it may be provided for each pixel of the sensor to be used during the acquisition of a color or black-and-white image, and for each sensor pixel to also be used during the acquisition of a depth map. As a variant, it may be provided to only use a first pixel assembly during the acquisition of a color or black-and-white image and to use a second pixel assembly during the acquisition of a depth map, where the first and second assemblies may or not have pixels in common.

Finally, the practical implementation of the described embodiments and variations is within the abilities of those skilled in the art based on the functional indications given hereabove. In particular, it will be within the abilities of those skilled in the art to provide the filter(s) covering each pixel Pix. For example, when a pixel Pix is configured to acquire the red, respectively green, respectively blue component of a pixel of a color image, and to receive infrared light to acquire depth data during the acquisition of a depth map, this pixel Pix will be coated with at least one filter configured to only give way to infrared light and red, respectively green, respectively blue light.

The invention claimed is:

1. A sensor, comprising:
a doped semiconductor substrate of a first conductivity type;
an array of pixels formed in the doped semiconductor substrate;
wherein each pixel of said array is formed in a portion of the doped semiconductor substrate that is laterally delimited by a vertical insulation structure and comprises:
an image sensing assembly comprising:
a first region of the first conductivity type in said portion of the doped semiconductor substrate, wherein said first region is more heavily doped than the doped semiconductor substrate; and
a first vertical transfer gate completely laterally surrounding the first region; and
at least two depth sensing assemblies, wherein each depth sensing assembly comprises:
a second region of the first conductivity type in said doped portion of the doped semiconductor substrate, wherein said second region is more heavily doped than the doped semiconductor substrate; and
a second vertical transfer gate arranged opposite a corresponding portion of the first vertical transfer gate, wherein said second region is arranged between said second vertical transfer gate and said corresponding portion of the first vertical transfer gate.

2. The sensor according to claim 1:
wherein the vertical insulation structure penetrates into the doped semiconductor substrate from a first surface of the doped semiconductor substrate and extends across an entire thickness of the doped semiconductor substrate;
wherein the first region and each second region are arranged in the doped semiconductor substrate at said first surface; and
wherein the first vertical transfer gate and each second vertical transfer gate penetrate into the doped semiconductor substrate from said first surface.

3. The sensor according to claim 1, wherein each second vertical transfer gate penetrates into the doped semiconductor substrate from a first surface of the doped semiconductor substrate deeper than the first transfer gate.

4. The sensor according to claim 1, wherein the vertical insulation structure penetrates into the doped semiconductor substrate from a first surface of the doped semiconductor substrate and wherein neighboring pixels in the array at least partly share the vertical insulation structure.

5. The sensor according to claim 4, wherein each second vertical transfer gate is formed by a portion of the vertical insulation structure shared by neighboring pixels in the array.

6. The sensor according to claim 1, wherein neighboring pixels in the array share one of the second vertical transfer gates.

7. The sensor according to claim 1, wherein each second vertical transfer gate is arranged between said corresponding portion of the first vertical transfer gate of said pixel and a portion of the vertical insulation structure.

8. The sensor according to claim 1, wherein the second region is in contact with said second vertical transfer gate.

9. The sensor according to claim 1, wherein each pixel of said array further comprises:
a first readout circuit coupled to the first region; and
a second readout circuit coupled to each second region.

10. The sensor according to claim 1, further comprising a control circuit configured to generate control signals for controlling actuation of the first and second vertical transfer gates of the pixels.

11. The sensor according to claim 10, wherein each pixel of said array further comprises:
a first readout circuit coupled to the first region; and
a second readout circuit coupled to each second region; and
wherein the control circuit is further configured to control operation of the first and second readout circuits.

12. The sensor according to claim 10, wherein the control circuit is configured, when the sensor is operating during an acquisition of an image by the image sensing assembly, to:

maintain the first vertical transfer gate and each second vertical transfer gate of said pixel in an off-state during a phase of integration by the pixel; and then switch the first vertical transfer gate of said pixel to an on-state during a phase of reading out from the pixel.

13. The sensor according to claim 12, wherein the control circuit is configured, when the sensor is operating during an acquisition of a depth map by the pixels, to:

alternatively switch, successively and a plurality of times, the second vertical transfer gates of said pixel to the on-state during a phase of integration by the pixel; and then maintain each of the second vertical transfer gates in the off-state during a phase of reading out from the pixel.

14. The sensor according to claim 13, wherein the control circuit is further configured, while alternatively switching the second vertical transfer gates of said pixel, to control the first vertical transfer gate to implement an anti-blooming device.

15. The sensor according to claim 13, wherein the control circuit is further configured, while maintaining each of the second vertical transfer gates in the off-state, to control the first vertical transfer gate of said pixel in the on-state.

16. The sensor according to claim 13:

wherein the control circuit is configured so that the sensor operates in rolling shutter mode during the acquisition of the image by the image sensing assembly; and wherein the control circuit is configured so that the sensor operates in global shutter mode during the acquisition of the depth map by the at least two depth sensing assemblies.

17. The sensor according to claim 1, further comprising a capacitive element connected to each second region of each pixel.

18. An electronic device, comprising a sensor according to claim 1.

19. The electronic device according to claim 18, wherein said electronic device is a smart phone.

* * * * *